(12) United States Patent
Erickson et al.

(10) Patent No.: US 9,589,639 B1
(45) Date of Patent: Mar. 7, 2017

(54) MULTIPLE FET NON-VOLATILE MEMORY WITH DEFAULT LOGICAL STATE

(71) Applicant: International Business Machines Corporation, Armonk, NY (US)

(72) Inventors: Karl R. Erickson, Rochester, MN (US); Robert E. Kilker, Rochester, MN (US); Phil C. Paone, Rochester, MN (US); David P. Paulsen, Inver Grove Heights, MN (US); John E. Sheets, II, Zumbrota, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/932,142

(22) Filed: Nov. 4, 2015

(51) Int. Cl.
| | | |
|---|---|---|
| *G11C 17/12* | (2006.01) | |
| *G11C 16/04* | (2006.01) | |
| *H01L 27/115* | (2006.01) | |
| *G11C 16/26* | (2006.01) | |
| *G11C 16/10* | (2006.01) | |
| *G11C 5/06* | (2006.01) | |
| *H01L 27/105* | (2006.01) | |
| *H01L 27/112* | (2006.01) | |

(52) U.S. Cl.
CPC .......... *G11C 16/0483* (2013.01); *G11C 5/063* (2013.01); *G11C 16/10* (2013.01); *G11C 16/26* (2013.01); *G11C 17/12* (2013.01); *H01L 27/11568* (2013.01); *H01L 27/11573* (2013.01); *H01L 27/105* (2013.01); *H01L 27/112* (2013.01)

(58) Field of Classification Search
CPC ...................................................... G11C 17/12

USPC .......................................................... 365/104
See application file for complete search history.

(56) References Cited

U.S. PATENT DOCUMENTS

| | | | |
|---|---|---|---|
| 5,732,019 | A | 3/1998 | Urai |
| 6,347,053 | B1 | 2/2002 | Kim et al. |
| 6,438,036 | B2 | 8/2002 | Seki et al. |
| 7,031,196 | B2 | 4/2006 | Yeh et al. |
| 7,330,374 | B2 | 2/2008 | Mukunoki |
| 7,453,736 | B2 | 11/2008 | Lee |
| 7,936,629 | B2 | 5/2011 | Huang et al. |
| 7,974,134 | B2 | 7/2011 | Zhang et al. |
| 8,031,529 | B2 | 10/2011 | Sarin |
| 8,208,282 | B2 | 6/2012 | Johnson et al. |
| 8,432,186 | B1 * | 4/2013 | Zaitsu ................ H03K 19/1737 326/38 |

(Continued)

OTHER PUBLICATIONS

Erickson, et al., "Detection of Initial State by eFuse Array", U.S. Appl. No. 14/921,245, filed Oct. 23, 2015.

(Continued)

*Primary Examiner* — Son Mai
(74) *Attorney, Agent, or Firm* — Heather S. Chatterton

(57) ABSTRACT

A memory array has a NVM element with a plurality of FETs. A first set of FETs of the plurality of FETs is coupled to a bitline true of the memory array. The first set of FETs has a first channel width. A second set of FETs of the plurality of FETs is coupled to a bitline complement of the memory array. The second set of FETs has a second channel width. The first channel width is greater than the second channel width. The channel width disparity provides the NVM element of the unprogrammed memory array with a default state.

13 Claims, 4 Drawing Sheets

(56) References Cited

U.S. PATENT DOCUMENTS

| | | | |
|---|---|---|---|
| 8,860,459 B2 * | 10/2014 | Zaitsu | H03K 19/17764 326/38 |
| 8,976,609 B1 | 3/2015 | Frayer et al. | |
| 2009/0225614 A1 * | 9/2009 | Vernet | G11C 11/4091 365/205 |

OTHER PUBLICATIONS

Kilker, et al., "Non-Volatile Memory Sense Circuit", U.S. Appl. No. 14/574,462, filed Dec. 18, 2014.
Kilker, et al., "Non-Volatile Memory Sense Circuit", U.S. Appl. No. 14/576,325, filed Dec. 19, 2014.

* cited by examiner

MULTIPLE FET NON-VOLATILE MEMORY WITH DEFAULT LOGICAL STATE

BACKGROUND

The present disclosure relates to computer memory, and more specifically, to macros utilizing non-volatile memory.

Non-volatile memory is computer memory which can retain stored information even when not powered. Some types of non-volatile memory may contain field-effect transistors (FETs) which may be programmed. Charge trapping can be used to shift the threshold voltage of field-effect transistors.

SUMMARY

According to embodiments of the present disclosure, an apparatus and design structure method for a multiple-FET non-volatile memory (NVM) element which has a default logical state is disclosed. The apparatus and design structure include a first set of FETs coupled to a bitline true of the NVM element. The first set of FETs may have a first channel width. A second set of FETs may be coupled to a bitline complement of the memory array. The second set of FETs may have a second channel width. The first channel width may be greater than the second channel width.

A method of managing an NVM element is disclosed. The NVM element may be connected to a wordline and a bitline. The NVM element may utilize a first and second set of FETs. The first set of FETs may have a greater channel width than the second set of FETs. A wordline signal of the NVM element may be raised. A default logical state of the NVM element may be read. The default logical state may be read using a sense amplifier. The default logical state may be the result of the first set of FETs having a greater channel width than the second set of FETs. An EvenOddSelect signal of the NVM element may be selected with a multiplexor. The default logical state of the NVM element may be output to a circuit.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
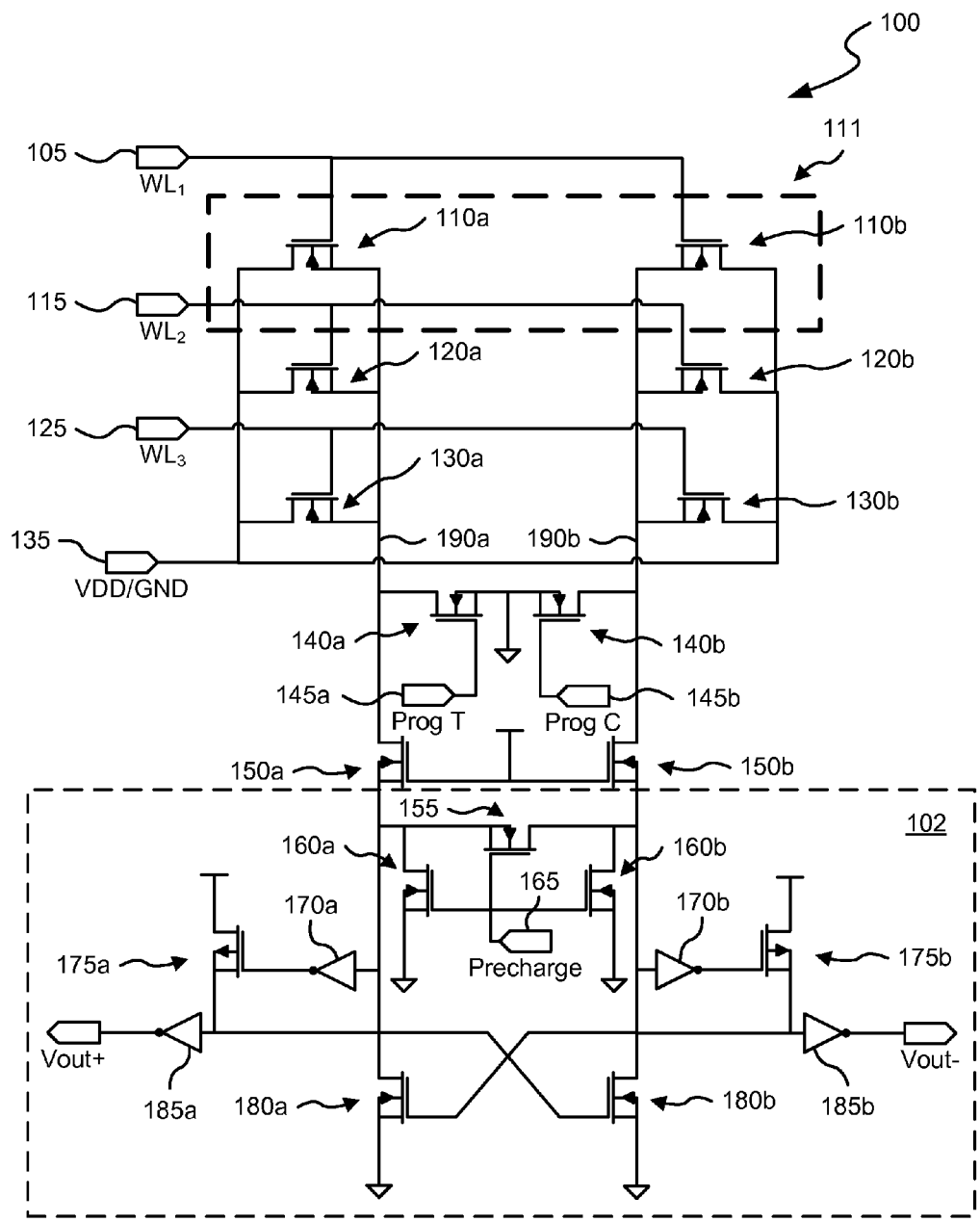
FIG. 1 depicts a diagram of a circuit using NVM elements with multiple FETs along with a sensing circuit for sensing the programming of the NVM elements, according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to memory arrays. A non-volatile memory (NVM) element may be comprised of a plurality of field-effect transistors (FETs). A majority of the channel width of the plurality of FETs may be coupled to one bitline of the NVM element. The channel width disparity may provide the NVM element with a default logical state. While the present disclosure is not necessarily limited to such applications, various aspects of the disclosure may be appreciated through a discussion of various examples using this context.

In instances, where traditional memory arrays utilize a plurality of FETs, channel width of the FETs may be balanced across a bitline, such that approximately half of the channel width of an NVM element is coupled to the bitline true while the other half is coupled to the bitline complement. As the wordline of a traditional NVM element with balanced channel width is raised, a bitline true or complement may turn on first as a result of threshold voltage (Vt) variation in the cell, which, across a plurality of NVM elements, provides an equal likelihood of respective bitlines of the plurality of NVM elements being the first to turn on. This will result in the created memory array not having a predictable known memory state. An equal likelihood may result in NVM elements not having a predictable default logical state, therein having an equal likelihood of being constructed as a logical zero or a logical one. Without a known state it may be difficult or impossible for a system to determine if such traditional NVM elements have been programmed or not programmed. Given that the programmed status of such traditional NVM elements may be difficult or impossible to determine, testing said traditional NVM elements with standard testing flows may be itself difficult or impossible.

Aspects of the disclosure relate to unbalancing the cell of an NVM element utilizing a plurality of FETs to create a default logical state. The NVM element may be created with a plurality of FETs. The majority of the FET current-carrying capacity (e.g., the channel width) of the NVM element may be coupled to either the bitline true or the bitline complement, while the rest of the FET current-carrying capacity is coupled to the bitline complement or the bitline true, respectively. Despite the unbalanced coupling of FETs, the NVM element may include a balanced physical placement of FETs. By attaching a majority of FETs to one of the two bitlines of an NVM element, the channel width may make the majority of FETs pull up its bitline faster than the minority bitline, therein starting a logical sequence which will reliably create a default logical state for the NVM element. The NVM element can later be programmed by changing the Vt to a preferred state. Constructing an NVM element such that it has a default logical state may have testing benefits as well as other benefits associated with avoiding NVM elements with no default logical state.

Embodiments of the disclosure may relate to circuits which utilize NVM elements with unbalanced cells and a sense circuit for sensing the state of such NVM elements. The NVM macro may have a plurality of FETs. The NVM elements may be unbalanced as a result of FETs which account for the majority of channel width of the NVM element (said FETs hereinafter referred to as the FET majority) being coupled to bitline true/complement, while FETs which hold the minority of channel width (said FETs hereinafter referred to as the FET minority) are coupled to bitline complement/true, respectively.

In some embodiments, both the FET minority and the FET majority may be individually comprised of a single FET, wherein the channel of the FET majority has more area than the channel of the minority FET. In other cases, the FET majority may comprise more FETs of the same physical dimension as the FET minority. Whether the FET majority is a single FET with greater channel area or is a combination of FETs, the FET majority may have a larger channel width than the FET minority. In some embodiments, the FET majority channel width may be at least three times larger than the channel width of the FET minority. The example channel width ratio of at least 3:1 between the FET majority and the FET minority may provide the NVM element with a default logical state. Programming the FETs to a state other than the default logical state may be completed with charge trapping to increase the threshold voltage (Vt) on the FET majority.

All FETs of an NVM element may share the same wordline signal. Before an NVM element is programmed, as the wordline signal increases, the FET majority of the NVM element will have the larger channel width and will complete the process of turning on before the FET minority turns on. By turning on first, the FET majority may pull its corresponding bitline up first (e.g., pulling up a bitline for the FET majority faster than the bitline connected to the FET minority).

After the NVM element is programmed, as the wordline signal increases, the FETs with the less channel width (e.g., the unprogrammed FET) will turn on first, pulling its corresponding bitline up first as well as pulling it up faster than the bitline connected to the set of FETs with the greater channel width (e.g., the programmed FETs). The sense circuit includes large cross-coupled negative channel FETs (NFETs) connected to bitlines. The bitline which rises first turns on the NFET connected to the opposing bitline which pulls the opposing bitline towards ground, therein preventing the opposing bitline from turning on the second NFET. This may keep the bitline for the unprogrammed FET(s) high and the bitline for the programmed FET(s) low.

In some embodiments, bitlines are further connected to a positive channel FET (PFET) keeper device which finishes the bitline, therein activating the corresponding NFET to full supply voltage (Vdd). Further, bitlines may be connected to inverters which output a signal for the sense circuit based on the voltages of respective bitlines.

Referring to FIG. 1, a diagram of an example memory circuit 100 with a sensing circuit 102 for sensing the programming of an NVM element is depicted. In some embodiments, the NVM element is an eFuse. Circuit 100 includes three NVM elements which utilize FET majorities and FET minorities to create a default logical state for the three NVM elements as described herein. A FET of FIG. 1 may be a majority through being a stacked FET majority (e.g., a single FET depicted in FIG. 1 may represent a plurality of FETs which are coupled just as the single depicted FET is coupled), or through being a single FET with a relatively larger channel than the single FET of the FET minority. However, for purposes of clarity, FIG. 1 depicts FETs 110a, 110b, 120a, 120b, 130a, and 130b as individual FETs.

In some embodiments, the FET majorities and minorities may alternate between the bitline true and the bitline complement, so that the bitline true and complement may be coupled to substantially similar capacities. A first NVM element includes FETs 110a-b (e.g., 110a is a FET majority while 110b is the FET minority). A second NVM element includes FETs 120a-b (e.g., 120a is a FET minority while 120b is the FET majority). A third NVM element includes FETs 130a-b (e.g., 130a is a FET majority while 130b is the FET minority). Additionally, while FETs 110a, 120b, and 130a are described as FET majorities and FETs 110b, 120a, 130b are described as FET minorities for purposes of clarity, in other embodiments this configuration may be switched for one or all NVM elements of FIG. 1. Only one of each FET pair (e.g., where 110a and 110b is a pair, 120a and 120b is a pair, 130a and 130b is a pair) may be a FET majority, while the other may be the FET minority.

FET majorities 110a, 120b, 130a may consist of single FETs which have channel widths having more area (e.g., three times more) than the area of the channels of FET minorities 110b, 120a, 130b. Alternatively, FET majorities 110a, 120b, 130a may be stacked FET majorities as shown, for example, in FIG. 2A (e.g., where an NVM element 111 equates to an NVM element 230 or an NVM element 240). Although three NVM elements are depicted in FIG. 1 for purposes of explanation, any number of NVM elements may be included in other implementations of an NVM element array. There is a wordline signal for each of the NVM elements. Wordline 105 is shared by FETs 110a-b. Wordline 115 is shared by FETs 120a-b. Wordline 125 is shared by FETs 130a-b.

To program one of the FETs of a NVM element, a high voltage may be applied to the FET through the corresponding wordline and supply voltage 135. In some embodiments an NVM element is reliably created with a default logical state, so FETs may only be programmed in order to switch to the alternate logical state. In such embodiments, the high programming voltage must be applied to the FET majority, such that its Vt is increased sufficiently to delay the rising of the corresponding bitline to "lose" to the opposing bitline coupled to the FET minority.

The bitline for the FET to be programmed (e.g., the FET majority) may be grounded to provide a path of electrons through the FET. Electrons may be trapped in the gate dielectric of the NFET or holes trapped in the gate dielectric of the PFET, either of which may lead to a higher absolute Vt for the respective FET type. In other embodiments, the circuit of FIG. 1 may be completed in a complimentary manner, using PFETs instead of NFETs. Being as FET majorities are depicted/discussed as FETs 110a and 130a, program complement 145a may be activated to turn on FET(s) 140a and bring bitline 190a down to ground to program either FET(s) 110a or FET(s) 130a, with the inverse true for FET majority 120b (due to the inverted coupling relative to FET majorities 110a and 130a). Similarly, if FET majorities and FET minorities were switched, program true 145b may be activated to turn on FET(s) 140b and bring bitline 190b down to ground to program either FET(s) 110b or FET(s) 130b, with the inverse true for a possible FET 120a (due to inverted coupling relative to FET groups 110, 130).

For example, to program FET 110b, wordline 105 and supply voltage 135 are set to a high voltage. Program complement 145b is made high to activate FET(s) 140b and pull bitline 190b toward ground. This causes high energy electrons (charge carriers) to flow through the channel of NFET (FET) 110a and become trapped in the gate dielectric of the device causing the absolute value of the Vt to increase.

FETs 150*a-b* may be configured to protect sense circuit 102 from the high voltage produced during the programming of NVM elements.

To prepare for sensing a NVM element, bitlines 190*a-b* may be precharged to ground and balanced. Precharge 165 may be brought high to activate NFET 155, which balances bitlines 190*a-b*, and to activate NFETs 160*a-b* to bring bitlines 190*a-b* to ground. Supply voltage 135 is applied and the wordline applied to the applicable NVM element rises. A slow wordline slew may be used to help differentiate between the programmed and unprogrammed FETs in the NVM element. For example, a slow wordline slew may identify increases of 10% Vdd to 90% Vdd in about 200-800 ps (picoseconds). As the wordline voltage increases, it may activate the FETs of the NVM element, causing the voltage of the corresponding bitlines to increase. The programmed FET(s) may turn on last as it has a higher Vt. Thus, the bitline connected to the unprogrammed FET(s) may increase faster than the bitline connected to the programmed FET.

NFETs 180*a-b* may be configured to pull the connected bitline to ground when turned on by the other bitline. NFET 180*a* is configured to pull bitline 190*a* toward ground in response to the increase in voltage of bitline 190*b*. Similarly, NFET 180*b* is configured to pull bitline 190*b* toward ground in response to the increase in voltage of bitline 190*a*. Thus, the bitline whose voltage rises faster may keep rising while preventing the other bitline from rising. NFETs 180*a-b* may be much larger than the FETs of the NVM elements such that they overpower the FET(s) quickly when pulling the corresponding bitline to ground.

Additionally, inverters 170*a-b* and PFETs 175*a-b* may be configured to pull the faster rising bitline to full Vdd rail. Inverters 170*a-b* may be configured to change output from high to low once the input bitline reaches a specified voltage. The low output may turn on the corresponding PFET 175*a* or 175*b*, which therein brings the bitline to full Vdd rail.

Inverters 185*a-b* may provide output from sense circuit 102. Inverter 185*a* may provide the main output for sense circuit 102. For example, a high output from inverter 185*a* may represent a logical one and a low output may represent a logical zero.

For example, assume FET(s) 120*b* have been programmed. To read the NVM element containing FETs 120*a-b*, bitlines 190*a-b* are balanced and brought to ground with precharge 165. Precharge 165 is turned off and wordline 125 is slowly raised. FET(s) 120*b* may have been altered to have a larger channel width than FET(s) 120*a*. Thus, FET(s) 120*b* will supply more charge and cause bitline 190*b* to rise before bitline 190*a*. Bitline 190*b* will turn on NFET 180*a* which will pull bitline 190*a* toward ground. Inverter 170*b* will change its output to low in response to rising bitline 190*b* and activate PFET 175*b* to bring bitline 190*b* to Vdd rail. The main output from inverter 185*a* will be high (e.g., a logical zero) in response to bitline 190*a* being low and the output of inverter 185*b* will be low in response to bitline 190*b* being high. Sense circuit 102 may stay in this state until a new precharge is grounded.

Figure 2:
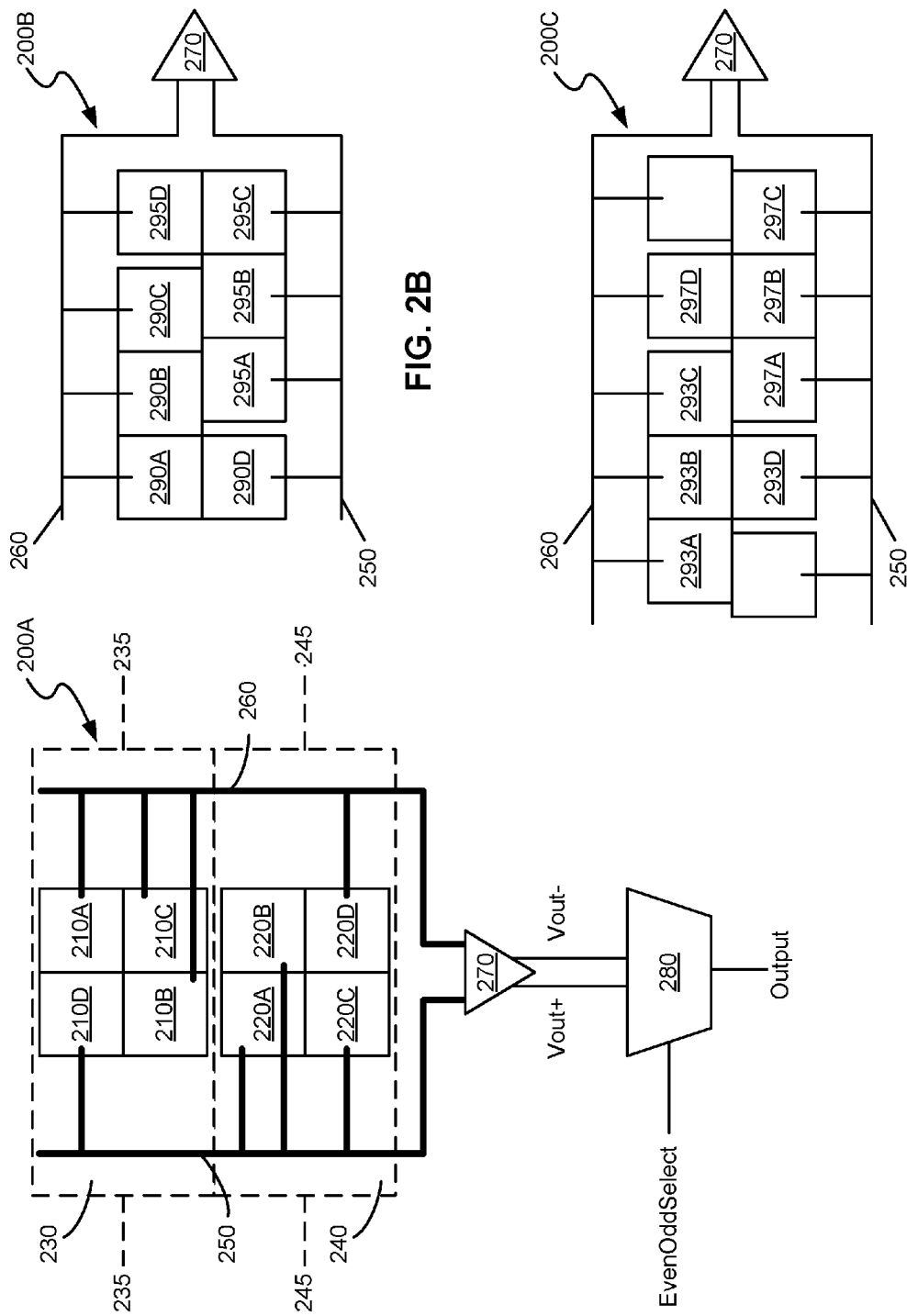
FIGS. 2A, 2B, and 2C depict diagrams of configurations of NVM elements which utilize FETs and have a default logical state, according to embodiments.

FIG. 2A depicts an array of NVM elements which are unbalanced, according to embodiments. In some embodiments, the NVM elements may be eFuses. The NVM element array 200A may be part of a circuit. The NVM element array 200A depicts two NVM elements 230, 240. The NVM element 230 is comprised of four FETs 210 and the NVM element 240 is comprised of four FETs 220. In some embodiments, all FETs of a particular NVM element may have substantially similar physical properties. In other embodiments, an NVM element may be comprised of physically disparate FETs (e.g., having differing channel areas) which create different capacities for the FETs. Whether all FETs of the NVM element are substantially similar or disparate, the differing capacity of the two FET sets may result in the respective NVM element being unbalanced.

The NVM element array 200A may include any number of NVM elements 230, 240. In addition, NVM elements 230, 240 may each contain any number of FETs 210, 220 so long as the FETs of an NVM element are unbalanced. In some embodiments, an NVM element may be unbalanced as a result of relatively more FETs 210, 220 of the NVM elements being coupled to the bitline 250 true than to the bitline complement 260, or vice versa (e.g., the NVM elements being unbalanced at a 3:1 ratio). In other embodiments, an NVM element may be unbalanced due to FETs of one side of a NVM element having a larger channel area (e.g., due to having a wider channel) than FETs of the other side of the NVM element (e.g., the channel areas being larger at a 3:1 ratio). While in FIG. 2A only a single bitline true 250 and the bitline complement 260 are depicted, in other embodiments any number of bitline pairs may be possible.

The NVM element array 200A may include a first NVM element 230. The NVM element 230 is comprised of four FETs 210A, 210B, 210C, and 210D. FET 210D may be connected to the bitline true 250, while FETs 210A, 210B, and 210C are coupled to the bitline complement 260. As a wordline 235 of NVM element 230 is raised as described herein, the FET 210D coupled to bitline true 250 and the FETs 210A, 210B, 210C are coupled to bitline complement 260 may start turning on at the same time. However, due to the greater combined channel width of the three depicted FETs 210B, 210C, 210D coupled to bitline complement 260, the bitline complement 260 will reliably complete the action of turning on relatively quicker than the bitline true 250.

In the embodiment shown in FIG. 2A, the reliability of the FET majority 210A, 210B, 210C, to turn on faster and therein force the current to run a specific way gives the NVM element 230 a predictable default logical state. A sense amplifier 270 on the same bitline as the NVM element 230 may be substantially similar to the sense circuit 102 of FIG. 1. The sense amplifier 270 may read this default logical state as described above with regards to the sense circuit 102. The sense amplifier 270 may then provide a Vout+ and Vout− output using inverters (e.g., inverters 185 from FIG. 1) to a 2:1 multiplexor 280. The multiplexor 280 may use an EvenOddSelect signal to select a NVM element which corresponds with the respective default logical state according to the alternating NVM element configuration (e.g., alternating across the bitline true and bitline complement to balance the capacity coupled to the bitline true and bitline complement). The multiplexor 280 provides the default logical state to the primary output.

In certain embodiments, an NVM element 230 may have more or less than the four FETs 210 depicted in FIG. 2A. Where the NVM element 230 has more than four FETs 210 with substantially similar physical properties (e.g., similar channel length, similar channel width, and similar resulting voltage), a 2:1 or higher ratio is maintained, in some such embodiments, between the number of FETs in the FET majority and FETs in the FET minority. For example, a 4:1 ratio between FETs in the FET majority versus FETs in the FET minority may be acceptable, in some embodiments, while a 2:1 ratio between the majority and minority may not be acceptable, in other embodiments. In embodiments where an NVM element 230 includes less than four FETs 210, the FET majority will include a greater channel width than FET minority. As discussed above, the predetermined ratio can be a 3:1 or higher ratio between the channel width of the FET majority and the channel width of the FET minority.

For example, an NVM element may have one FET in a FET majority and one FET in a FET minority. The FET in the FET majority may have physical dimensions which are substantially similar to the physical dimensions of the FET in the FET minority, except that the width of the channel of the majority FET is wider (e.g., three times wider) than the width of the minority FET. A width which is three times wider can grant three times the general area within the channel of the FET in the FET majority. In other embodiments, the majority FET could instead have a length which was longer (e.g., at least three times) than the length of the minority FET to the same effect.

Alternatively, the NVM element array 200A may include FET majorities connected to the bitline complement, as depicted for NVM element 240. As shown in FIG. 2A, the NVM element 240 includes the FET majority 220A, 220B, 220C connected to the bitline true, while the FET minority 220D is connected to the bitline complement. In response to wordline 245 of NVM element 240 being raised, the FETs 220 of the NVM element 240 will begin to turn on, and the FET minority 220D will complete turning on slower than the FET majority 220A, 220B, 220C due to the smaller channel width of the FET 220D. By turning on, the FET minority may force the current to run through a predictable bitline (e.g., said bitline being predictable dependent on configuration of other connections and components of the NVM element array and circuit) to give the NVM element 240 a predictable default logical state.

The sense amplifier 270 on the same bitline as the NVM element 240 will read this default logical state and, after the state is paired with an EvenOddSelect signal selected from a multiplexor 280, the state will be sent to the primary output. In this way an array of NVM elements with unbalanced cells and default logical state for the NVM element and be read by a sense amp 270 and paired with the EvenOddSelect signal selected by a multiplexor 280 before being passed to a primary output.

The default logical state of NVM element 240 may or may not be different than NVM element 230. In some embodiments, all NVM elements which are unbalanced in an NVM element array 200A may have the same default logical state. In other embodiments, the default logical state of NVM elements which are unbalanced in an array 200A may differ. In certain embodiments, other components of a circuit which includes the NVM elements may be constructed and tested with knowledge of the default logical state of each NVM element—regardless of whether all NVM elements have a logical state of one, zero, or a predetermined combination of ones and zeros—such that a circuit which includes such NVM elements may be adequately tested.

After creation, NVM elements may be programmed to a logical state other than the default logical state. The state of the NVM element may be changed by adding Vt to FETs of the NVM element. The Vt may need to be altered such that the current runs through the alternate bitline of the NVM element. For example, in NVM element 230, the current may be running through the bitline true 250. The Vt of the FET majority 210A, 210B, 210C may be raised such that it may complete turning on faster than the FET minority 210D. Through altering the Vt of the NVM element 230, the current may be forced to go through the bitline complement 260, changing the state of the NVM element 230.

The FETs of an unbalanced NVM element may be mirrored across an NVM element array 200A. In some embodiments, mirroring FETs across an NVM element array may include physically positioning FETs on a circuit board such that said FETs are symmetrically even across a bitline. Put differently, for bitlines which include an NVM element which is unbalanced, there may be an equal amount of FETs on both sides of a bitline, said FETs being located directly across from each other, even while more FETs of an NVM element are connected to a bitline true than the bitline complement (or vice versa).

For example, FIG. 2A depicts a first NVM element 230 with mirrored FETs coupled in a 3:1 ratio to the bitline complement, where one FET 210B which is part of the FET majority is located on the side of the FET minority, allowing for the set of FETs to be centered on a nexus of the bitline and wordline. Alternatively, FIG. 2B depicts an NVM element array 200B with mirrored FETs where each FET is positioned by the bitline which it is coupled to. Specifically, a first NVM element may comprise four FETs 290. The FET minority 290D of the first NVM element may be connected to the bitline true 250 and arranged next to the bitline true. The FETs 290A, 290B, 290C of the FET majority may be connected to the bitline complement 260 and may be arranged next to the bitline complement 260 as depicted in FIG. 2B. A second NVM element may include another four FETs 295 and may complete the mirrored presentation of FETs within the NVM element array 200B by itself mirroring the location of FETs of the first NVM element. To occupy the spots open along the bitline true 250, the FETs 295A, 295B, 295C of the FET majority may be connected to and located alongside the bitline true 250, while the FET minority may be connected to and located next to the bitline complement 260. In this way an NVM element array 200B may include unbalanced NVM elements while also mirroring FET placement, to increase the efficiency of components upon a circuit.

Alternatively, FIG. 2C depicts an NVM element array 200C with mirrored FETs where each FET is positioned by the bitline which it is coupled to. Specifically, a first NVM element may comprise four FETs 293. The FET minority 293D of the first NVM element may be connected to the bitline true 250 and arranged next to the bitline true 250. The FETs 293A, 293B, 293C of the FET majority may be connected to the bitline complement 260 and may be arranged next to the bitline complement 260 as depicted in FIG. 2B, such that the FET minority 293D may be opposite of the "middle" FET of the FET majority. A second NVM element may include another four FETs 297 and may mesh with the mirrored presentation of FETs within the NVM element array 200C by itself mirroring the location of FETs of the first NVM element. To occupy the spots open along the bitline true 250, the FETs 297A, 297B, 297C of the FET majority may be connected to and located alongside the bitline true 250, while the FET minority 297D may be connected to and located next to the bitline complement 260. In some embodiments the FETs of the NVM element array 200C may not include the depicted gaps between FETs 293 of the first NVM element and FETs 297 of the second NVM element, instead including FETs which are equally spaced on a bitline true 250 and complement 260 throughout the NVM element array 200C. In this way an NVM element array 200C may include unbalanced NVM elements while also mirroring FET placement, to increase the efficiency of components upon a circuit.

Figure 3:
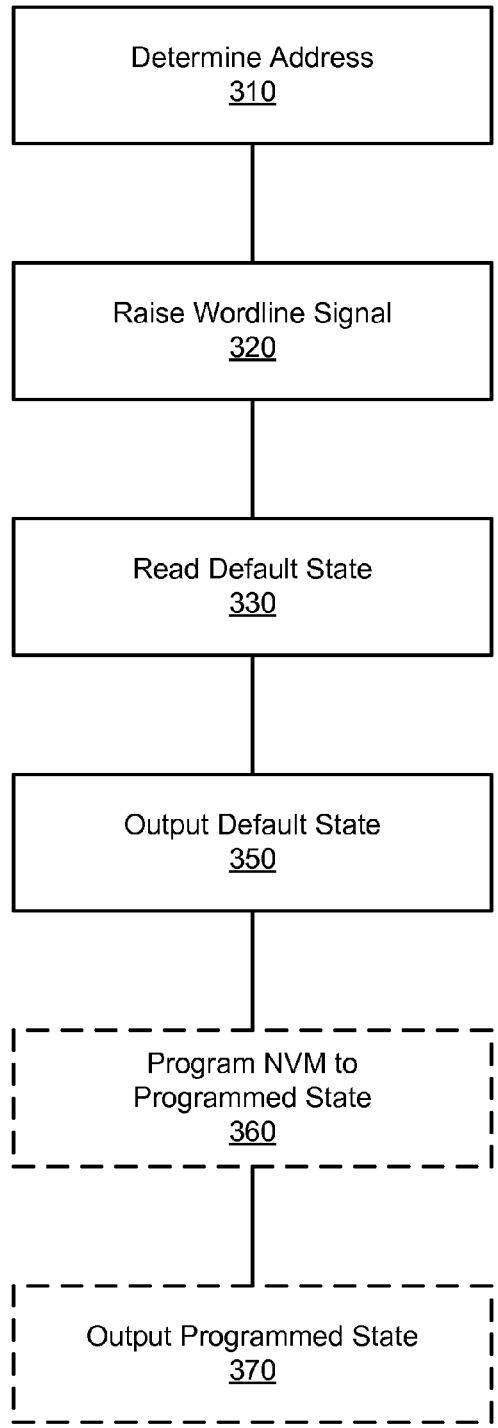
FIG. 3 depicts a method for providing an NVM element utilizing FETs with a default logical state, according to embodiments.

FIG. 3 depicts a method 300 of using an unbalanced NVM element. The NVM element arrays may be similar to the NVM elements array with unbalanced NVM elements described in FIG. 1 and FIGS. 2A-2C herein. The NVM element may be a component of a circuit. The circuit may include any number of NVM elements within an NVM element array as described herein. The visual arrangement of blocks in the flowchart of FIG. 3 is not to be construed as limiting the order in which the individual acts/operations may be performed, as certain embodiments may perform the operations of FIG. 3 in alternative orders.

At block 310 an EvenOddSelect signal relating to the NVM element is determined. The EvenOddSelect signal is determined by a multiplexor, which may select the EvenOddSelect signal which corresponds to the NVM element due to NVM elements alternating along a bitline to maintain relatively equal capacity across the bitline true and bitline complement. In some embodiments, an address decoder may be used instead of a multiplexor. At block 320 a wordline signal of an unbalanced NVM is raised. The NVM element may comprise a plurality of FETs. Some of the FETs of the NVM element (e.g., first set of FETs) may be connected to a bitline true of the NVM element, while the rest of the FETs of the NVM element (e.g., second set of FETs) are connected to the bitline compliment of the NVM element. These two sets of FETs (e.g., a first set connected to the bitline true and a second set connected to the bitline complement) are unbalanced. In particular, the sets are unbalanced in regards to the channel width of the two sets. One of the two set of FETs may have at least three times the channel width of the other set, in some embodiments.

For example, an NVM element may be comprised of four similar FETs, three of which are connected to the bitline true while the fourth is connected to the bitline complement. For another example, an NVM element may be comprised of two FETs: a first FET which is connected to the bitline complement, and a second FET which is substantially similar in physical attributes except for a channel which is wider (e.g., three times wider) than the channel of the first FET. The unbalanced ratio of channel width between the two sets of FETs provides the NVM element with a default logical state (e.g., a logical one or logical zero value which the NVM element may reliably hold upon creation). The default logical state may result from the bitline which is connected to comparatively more channel width having the ability to predictably and reliably turn on before the other bitline can turn on.

The signal may be raised before the NVM element is programmed to a logical state other than the default logical state. The FETs are coupled to the wordline. Raising the wordline signal may cause the two sides of FETs to begin turning on. The side of the NVM element with the greater channel width may turn on faster, bringing its respective bitline up. This may cause the current to run through a particular bitline. The bitline which the current will run through (e.g., the bitline true or bitline complement of the NVM element) may be controlled by connections and components of the circuit and/or NVM element array.

At block 330 the default logical state of the NVM element is read. The logical state of the NVM element is a predetermined/default logical state due to the ratio of channel width of the two sides of the NVM element. The ratio of channel width includes the FET majority being larger than the FET minority (e.g., the FET majority having a channel width which is three times larger than the channel width of the FET minority). The default logical state may be read by the sense amplifier as described herein. At block 350 the default logical state is sent to the primary output. The primary output may send the logical zero or one value of the NVM element to the circuit which includes the NVM element.

At block 360 the NVM element may be programmed to a specific logical state. In some embodiments, programming an NVM element entails changing the NVM element to an alternate logical state (e.g., from a default logical state of logical one to logical zero, or from a default logical state of logical zero to logical one). Programming the NVM element may comprise increasing the Vt of the FET majority, such that the greater current switches which bitline it flows through (e.g., the greater current is forced to flow through a bitline which the greater current did not flow through when the NVM element was in the default logical state). At block 370 the programmed state of the NVM element may be routed to the primary output. The programmed state of the NVM element may be output to the circuit of the NVM element. The programmed state may be read by the sense amplifier as in block 330 and matched to the NVM element as in block 310 before being outputted.

Figure 4:
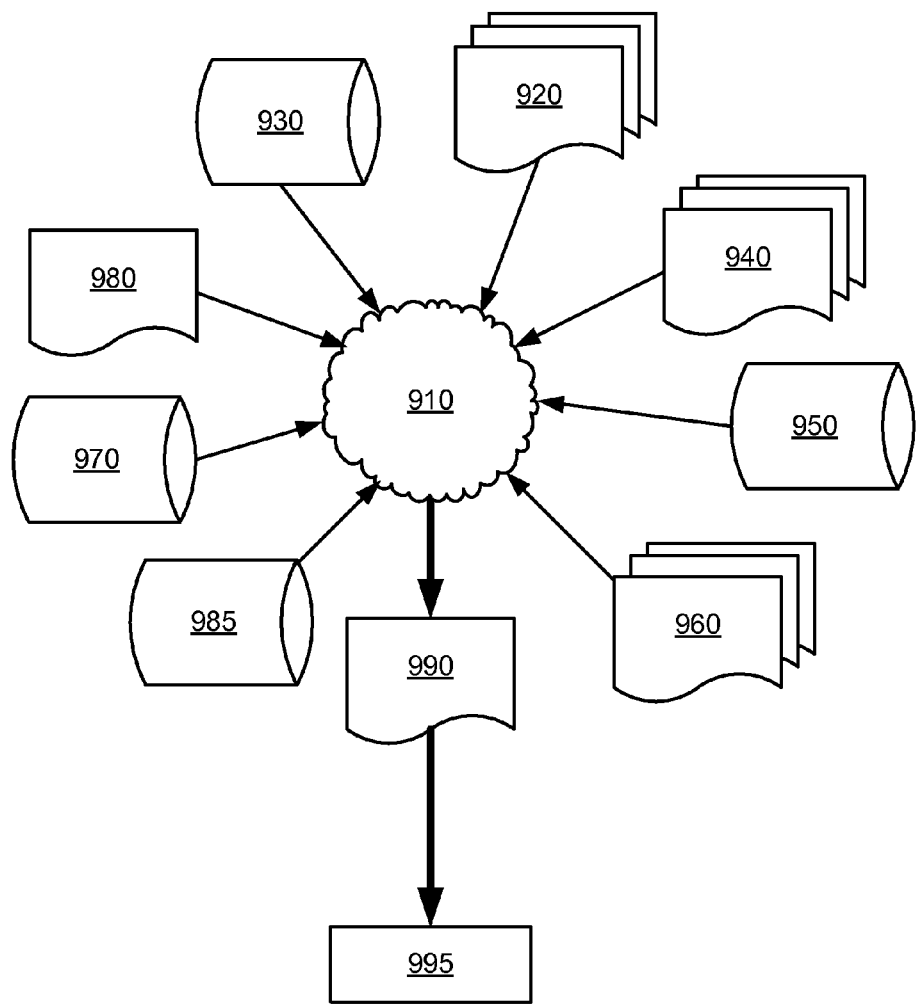
FIG. 4 depicts a flow diagram of a design process used in semiconductor design, manufacture, and/or test.

FIG. 4 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1, FIG. 2A, FIG. 2B, and FIG. 2C. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 1, FIG. 2A, FIG. 2B, and FIG. 2C. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 1, FIG. 2A, FIG. 2B, and FIG. 2C to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1, FIG. 2A, FIG. 2B, and FIG. 2C. In one embodiment, design structure 990 may comprise a compiled, executable HDL simulation model that functionally simulates the devices shown in FIG. 1, FIG. 2A, FIG. 2B, and FIG. 2C.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1, FIG. 2A, FIG. 2B, and FIG. 2C. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A non-volatile memory (NVM) element utilizing field effect transistors (FETs) comprising:
    a first set of FETs comprising one or more FETs coupled to a bitline true, wherein the first set of FETs coupled to the bitline true have a first channel width; and
    a second set of FETs comprising one or more FETs coupled to a bitline complement, wherein the second set of FETs coupled to the bitline complement have a second channel width, wherein the first channel width is larger than the second channel width, wherein:
        physical attributes of the one or more FETs in the first set of FETs are substantially similar to physical attributes of the one or more FETs in the second set of FETs; and
        the number of FETs in the first set of FETs outnumber the number of FETs in the second set of FETs by a ratio of at least three-to-one.

2. The NVM element of claim 1, wherein the one or more FETs of the first set of FETs and the one or more FETs of the second set of FETs are physically mirrored over both a bitline and a wordline of the NVM element.

3. The NVM element of claim 1, wherein:
the first set of FETs includes three FETs; and
the second set of FETs includes one FET.

4. The NVM element of claim 3, wherein:
two FETs of the first set of FETs are coupled to the bitline true and located near the bitline true;
one FET of the first set of FETs is coupled to the bitline true and located near the bitline complement; and
one FETs of the second set of FETs is coupled to the bitline complement and located near the bitline complement.

5. A non-volatile memory (NVM) element utilizing field effect transistors (FETs) comprising:
a first set of FETs comprising one or more FETs coupled to a bitline true, wherein the first set of FETs coupled to the bitline true have a first channel width; and
a second set of FETs comprising one or more FETs coupled to a bitline complement, wherein the second set of FETs coupled to the bitline complement have a second channel width, wherein the first channel width is larger than the second channel width, wherein the first set of FETs includes one FET and the second set of FETs includes one FET, wherein:
the one FET of the first set of FETs and the one FET of the second set of FETs are physically disparate;
the one FET of the first set of FETs includes a first channel having a first area and the one FET of the second set of FETs includes a second channel having a second area; and
the first area of the first channel is at least three times greater than the second area of the second channel.

6. The NVM element of claim 5, wherein the width of the first channel is at least three times wider than the width of the second channel.

7. A method of managing NVM elements, the method comprising:
raising a wordline signal for a wordline which is coupled to an NVM element, wherein the NVM utilizes a first and second set of FETs, wherein a first channel width of the first set of FETs which is coupled to a bitline true of the NVM element is greater than a second channel width of the second set of FETs which is coupled to bitline complement of the NVM element;
reading a default logical state of the NVM element using a sense amplifier, wherein the default logical state is the result of the first set of FETs having at least three times the channel width of the second set of FETs;
determining an EvenOddSelect signal of the NVM element using a multiplexor; and
outputting the default logical state of the NVM element to a circuit of the NVM element.

8. The method of claim 7, the method further comprising:
programming the NVM element to a programmed state, wherein the programmed state is a different logical state than the default logical state;
reading the programmed state of the NVM element using the sense amplifier;
determining the NVM element using the multiplexor; and
outputting the programmed state of the NVM element to the circuit of the NVM element.

9. The method of claim 8, wherein programming the NVM element further comprises increasing the Vt of the first set of FETs.

10. The method of claim 7, wherein:
FETs of the first set of FETs are substantially similar to FETs of the second set of FETs; and
FETs of the first set of FETs outnumber the FETs of the second set of FETs by a ratio of at least three-to-one.

11. The method of claim 10, wherein FETs of the NVM element are physically mirrored over both the bitline true and the wordline of the NVM element.

12. The method of claim 7, wherein:
the first set of FETs consists of a first FET which includes a first channel;
the second set of FETs consists of a second FET which includes a second channel; and
the area of the first channel is at least three times greater than the area of the second channel.

13. The method of claim 12, wherein a width of the first channel is at least three times wider than a width of the second channel.

* * * * *